(12) United States Patent
Nataraj

(10) Patent No.: US 6,906,937 B1
(45) Date of Patent: Jun. 14, 2005

(54) BIT LINE CONTROL CIRCUIT FOR A CONTENT ADDRESSABLE MEMORY

(75) Inventor: Bindiganavale S. Nataraj, Cupertino, CA (US)

(73) Assignee: Netlogic Microsystems, Inc., Mountain View, CA (US)

( * ) Notice: Subject to any disclaimer, the term of this patent is extended or adjusted under 35 U.S.C. 154(b) by 28 days.

(21) Appl. No.: 10/394,983

(22) Filed: Mar. 21, 2003

(51) Int. Cl.[7] ............................................. G11C 15/00
(52) U.S. Cl. ....................................... 365/49; 365/154
(58) Field of Search .......................... 365/49, 154, 156, 365/190, 189.11

(56) References Cited

U.S. PATENT DOCUMENTS

| | | | | |
|---|---|---|---|---|
| 5,966,319 A | * | 10/1999 | Sato ........................... | 365/154 |
| 6,075,729 A | * | 6/2000 | Ohhata et al. .............. | 365/190 |
| 6,256,241 B1 | * | 7/2001 | Mehalel ...................... | 365/201 |
| 6,785,179 B1 | * | 8/2004 | Bull et al. .................. | 365/203 |

* cited by examiner

Primary Examiner—Anh Phung
(74) Attorney, Agent, or Firm—William L. Paradice, III

(57) ABSTRACT

A bit line control circuit is coupled between a bit line of an associated Content Addressable Memory (CAM). Array and a supply voltage. The bit line control circuit adjusts the charge current for the bit line in response to a bit line control signal. For some embodiments, the bit line control circuit includes a dynamic component and a static component to control the bit line.

22 Claims, 9 Drawing Sheets

BIT LINE CONTROL CIRCUIT FOR A CONTENT ADDRESSABLE MEMORY

FIELD OF INVENTION

This invention relates generally to content addressable memories and specifically to improving the reliability of match results for content addressable memories.

BACKGROUND

A content addressable memory (CAM) device is a storage device having an array of memory cells that can be instructed to compare the specific pattern of a comparand word with data words stored in corresponding rows of the array. During a compare operation, the comparand word is provided to the CAM array and compared with all the CAM words. For each CAM word that matches the comparand word, a corresponding match line is asserted to indicate the match result. If any of the match lines are asserted, a match flag is typically asserted to indicate the match condition, and the match address or index of the highest priority matching entry in the CAM array is determined.

FIG. 1 shows a conventional binary CAM cell 100 including a memory cell 110 for storing a data bit D and a compare circuit 120 for comparing the data bit with a comparand bit C. Memory cell 110 includes a latch formed by cross-coupled inverters 112 and 114 that stores the data bit D at data node BLI and its complement at data node $\overline{\text{BLI}}$. Pass transistor 116 is coupled between node BLI and bit line BL, and has a gate coupled to a word line WL. Pass transistor 118 is coupled between node $\overline{\text{BLI}}$ and complementary bit line $\overline{\text{BL}}$, and has a gate coupled to word line WL. Compare circuit 120 includes NMOS transistors 122, 124, 126, and 128. Transistors 122 and 124 are coupled in series between match line ML and ground potential, with the gate of transistor 122 receiving the data bit D from node BLI and the gate of transistor 124 receiving the complement $\overline{\text{C}}$ of the comparand bit from complementary comparand line $\overline{\text{CL}}$. Transistors 126 and 128 are coupled in series between match line ML and ground potential, with the gate of transistor 126 receiving the complement D of the data bit from node $\overline{\text{BLI}}$ and the gate of transistor 128 receiving the comparand bit C from the comparand line CL. Having separate bit and comparand line pairs allows an array of CAM cells 100 to perform read and compare operations at the same time, which in turn may provide a performance advantage.

A weak PMOS pull-up transistor 10 is coupled between bit line BL and a supply voltage $V_{DD}$, and has a gate coupled to ground potential to maintain transistor 10 in a conductive state. Similarly, a weak PMOS pull-up transistor 12 is coupled between complementary bit line $\overline{\text{BL}}$ and $V_{DD}$, and has a gate coupled to ground potential to maintain transistor 12 in a conductive state. Together, pull-up transistors 10 and 12 pre-charge the bit line pair BL and $\overline{\text{BL}}$ toward $V_{DD}$ before and after read and write operations (e.g., when WL is de-asserted to logic low).

However, pull-up transistor 10 also pulls BL to a voltage between $V_{DD}$ and ground potential when BLI is a logic zero and WL is asserted to logic high (e.g., during read and write operations). Similarly, pull-up transistor 12 also pulls $\overline{\text{BL}}$ to a voltage between $V_{DD}$ and ground potential when $\overline{\text{BLI}}$ is a logic zero and WL is asserted to logic high. As a result, when simultaneously performing read and compare operations on CAM cell 100, bit line charge currents provided by pull-up transistors 10 and 12 may result in erroneous mismatch conditions indicated on the match line ML.

For example, during a compare operation between a logic low data bit D and a logic low comparand bit C (i.e., a match condition), CAM cell 100's internal data nodes BLI and $\overline{\text{BLI}}$ are at approximately ground potential (D=0) and $V_{DD}$ ($\overline{\text{D}}$=1), respectively, and the match line ML is pre-charged to $V_{DD}$ by a well-known pre-charge circuit (not shown for simplicity). Comparand lines CL and $\overline{\text{CL}}$ are driven to approximately ground potential (C=0) and $V_{DD}$ ($\overline{\text{C}}$=1), respectively. The logic high signals at node $\overline{\text{BLI}}$ and on line $\overline{\text{CL}}$ turn on transistors 126 and 124, respectively, and the logic low signals at node BLI and on line CL turn off transistors 122 and 128, respectively. Thus, because transistors 122 and 128 are non-conductive, compare circuit 120 does not discharge match line ML, which remains in its charged state to indicate the match condition.

If there is a concurrent read operation for CAM cell 100, the word line WL is driven to logic high to turn on pass transistors 116 and 118, which in turn couple the gate of transistor 122 to bit line BL and the gate of transistor 126 to complementary bit line $\overline{\text{BL}}$, respectively. Because pull-up transistor 10 remains conductive, data node BLI is undesirably charged towards $V_{DD}$ via pass transistor 116 and pull-up transistor 10 during the compare operation. As the voltage on node BLI approaches the threshold voltage $V_T$ of transistor 122, transistor 122 conducts a leakage current that begins discharging match line ML through transistor 124 towards ground potential. Thus, for a CAM array having many CAM cells 100 per row, the cumulative leakage current in compare circuits 120 of all CAM cells 100 in a selected row may sufficiently discharge the match line ML to erroneously indicate a mismatch condition for the row.

As semiconductor fabrication technologies become smaller, supply voltages and transistor threshold voltages become smaller, which in turn may exacerbate these undesirable leakage currents during concurrent read and compare operations. Further, when word line WL is selected for read and write operations, the conductive pull-up transistors 10 and 12 form current paths to ground potential through pass transistors 116 and 118 and pull-down transistors (not shown) in inverters 112 and 114. These current paths to ground potential may result in undesirable power dissipation.

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

A method and apparatus for controlling the bit lines of a CAM array are described below in the context of a CAM device 200 for simplicity only. It is to be understood that embodiments of the present invention may be used in any suitable CAM array or device including, for example, binary, ternary, or quaternary CAM arrays having either NOR or NAND type compare circuits. Further, the logic levels assigned to various signals in the description below are arbitrary and, thus, may be modified (e.g., reversed polarity) as desired. Additionally, the interconnection between circuit elements or blocks may be shown as buses or as single signal lines. Each of the buses may alternatively be a single signal line, and each of the single signal lines may alternatively be a bus. Accordingly, the present invention is not to be construed as limited to specific examples described herein but rather includes within its scope all embodiments defined by the appended claims.

Embodiments for controlling the bit lines of a CAM array improve the reliability of match results during concurrent read and compare operations by providing a relatively small bit line charge current during a sensing phase of the read operation and providing a relatively large bit line charge current during a recovery phase of the read operation. The relatively small bit line charge current minimizes the inadvertent charging of data nodes within the CAM cells during compare operations, which in turn minimizes undesirable leakage currents in the CAM cells that result in erroneous indications of the mismatch condition. The relatively large bit line charge current quickly resets the bit line(s) to the charged state to minimize latency between read operations. For other embodiments, the relatively small bit line charge current is provided when there is a compare operation, and the relatively large bit line charge current is provided when there is not a compare operation.

Figure 2:
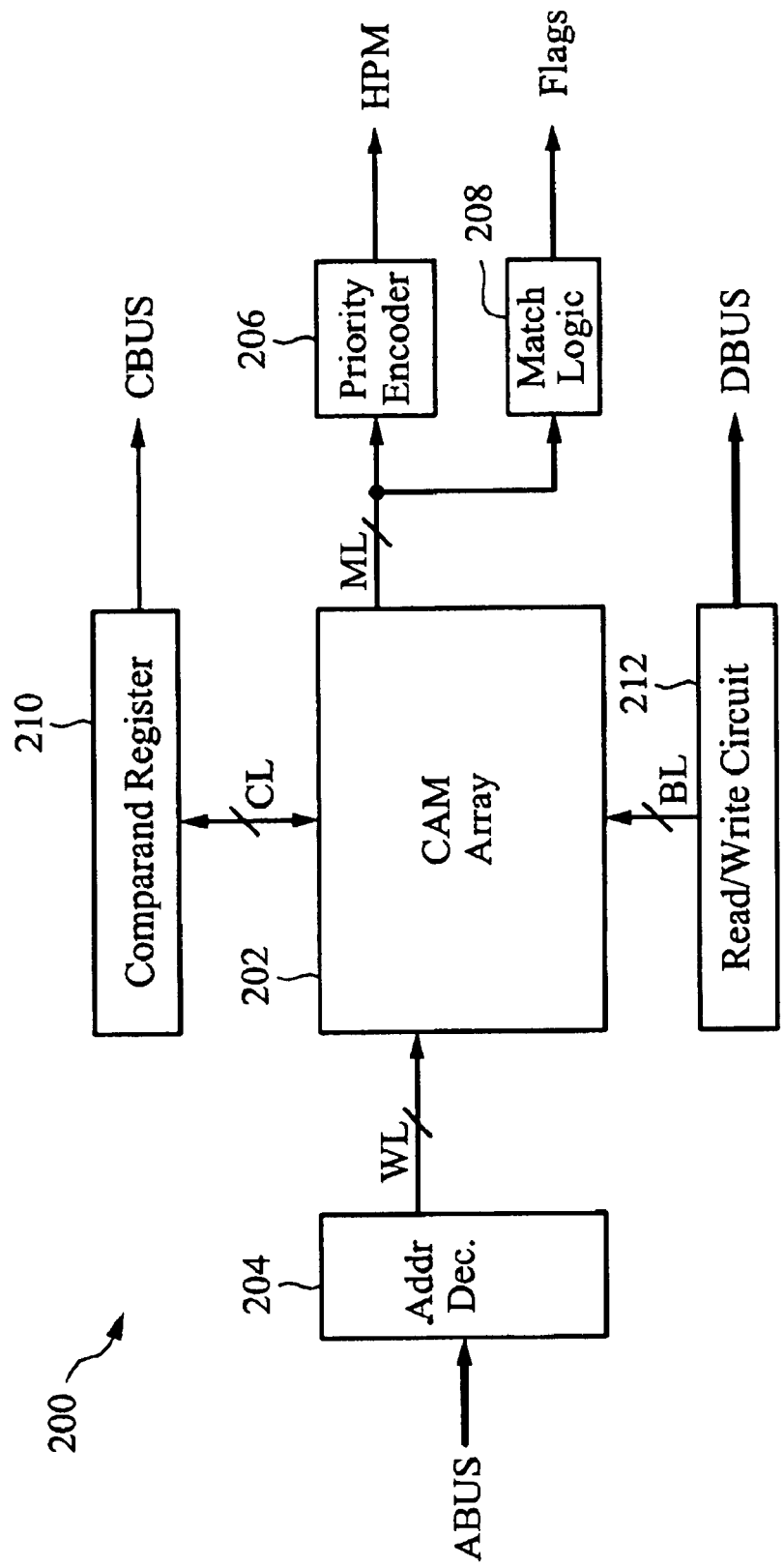
FIG. 2 is a block diagram of a CAM device within which embodiments of the present invention may be implemented.

FIG. 2 shows an exemplary CAM device 200 within which embodiments of the present invention may be implemented. CAM device 200 includes a CAM array 202 that has a plurality of CAM cells (not shown in FIG. 2 for simplicity) arranged in any number of rows and columns. The CAM cells in array 202 may be any suitable type of CAM cell. One or more instructions and related control signals may be provided to CAM device 200 from an instruction decoder (not shown for simplicity) to control read, write, and compare operations for CAM device 200. Other well-known signals which may be provided to CAM device 200, such as enable signals, reset signals, and clock signals, are not shown for simplicity.

Each row of CAM cells in array 202 is coupled to an address decoder 204 via a corresponding word line WL, and to a priority encoder 206 and to match logic 208 via a corresponding match line ML. The word lines and match lines are represented collectively in FIG. 2 for simplicity. For one embodiment, address decoder 204 receives addresses from an address bus ABUS. For other embodiments, address decoder 204 receives addresses from another bus. The match lines ML provide match results for compare operations to priority encoder 206, which determines the matching entry that has the highest priority number associated with it and generates the index or address of this highest priority match (HPM). Match logic 208 may generate a match flag to indicate a match condition, and may also generate a multiple match flag to indicate multiple matches.

Further, although not shown in FIG. 2 for simplicity, each row of CAM cells in array 202 may have one or more validity bits to indicate whether the corresponding row (or segment thereof) of CAM cells is in a valid state or an empty state. The validity bits may be provided to priority encoder 206 to generate the next free address (NFA) that is available in CAM array 202 for storing new data. The validity bits may also be provided to a well-known full flag logic circuit (not shown for simplicity) to generate a full flag and/or empty flag for CAM array 202.

Each column of CAM cells in array 202 is coupled to a comparand register 210 via comparand lines CL and to a read/write circuit 212 via bit lines BL. Comparand register 210 provides a comparand word (e.g., search key) received from a comparand bus CBUS to CAM array 202 for comparison with entries stored in CAM array 202. For other embodiments, comparand words may be provided to comparand register 210 from another bus. Read/write circuit 212 includes well-known write drivers and sense amplifiers, and is coupled to a data bus DBUS. Although not shown for simplicity, CAM device 200 may also include a global mask circuit that stores one or more mask patterns that mask entries in CAM array 202 during compare operations with the comparand word provided by comparand register 210.

Figure 3:
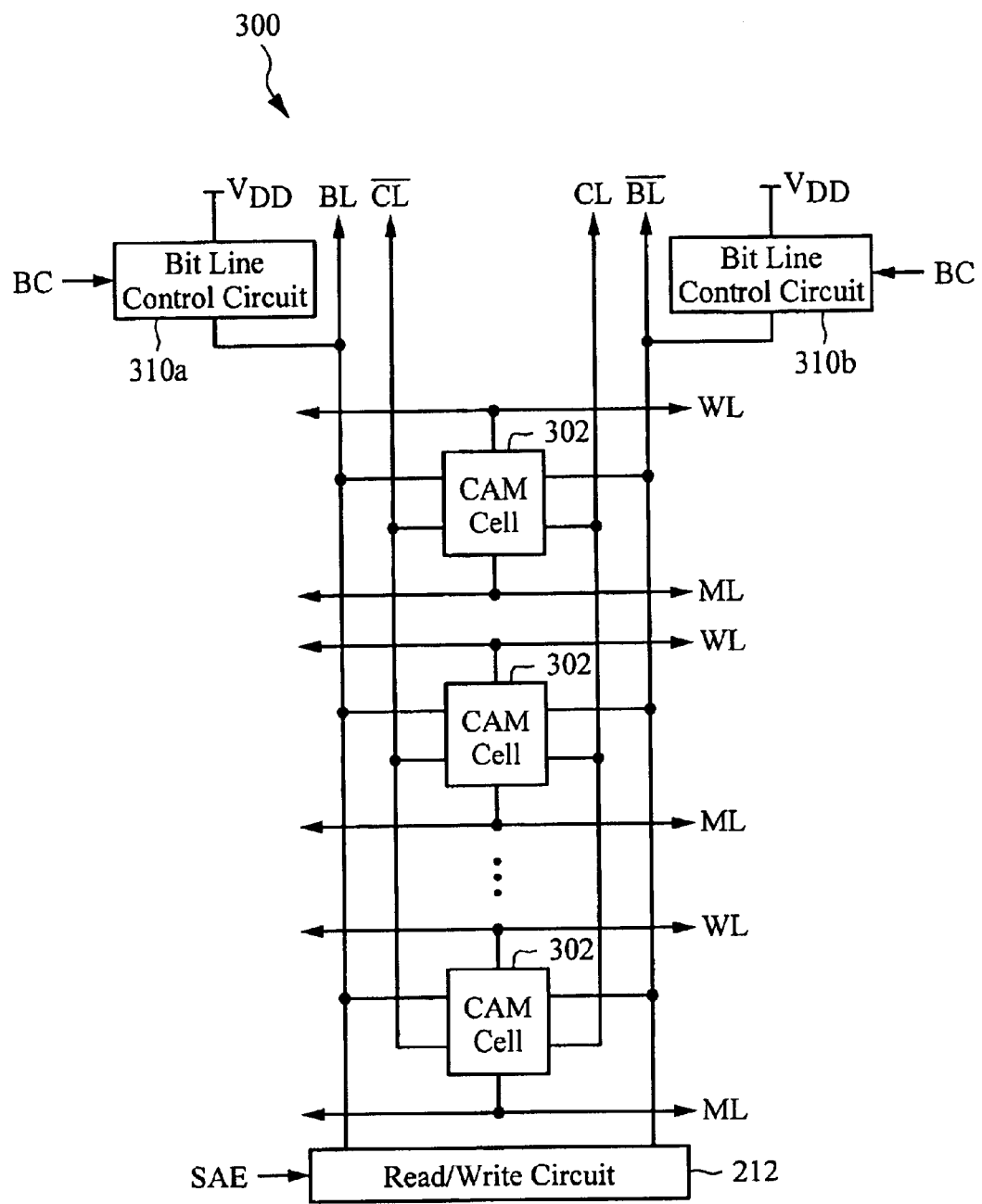
FIG. 3 is a block diagram of a column of the CAM array of FIG. 2 including a bit line control circuit in accordance with one embodiment of the present invention.

FIG. 3 shows a column 300 for one embodiment of the CAM array 202 of FIG. 2. Column 300 includes a plurality of CAM cells 302 and bit line control circuits 310a and 310b. CAM cells 302, which include at least one storage element and at least one compare circuit to compare comparand data with data stored in the storage element, are well-known, and may be any suitable binary, ternary, or quaternary cell implemented using volatile memory including, for example, Static Random Access Memory (SRAM) or Dynamic RAM (DRAM). For other embodiments, CAM cells 302 may be implemented using non-volatile memory.

Figure 1:
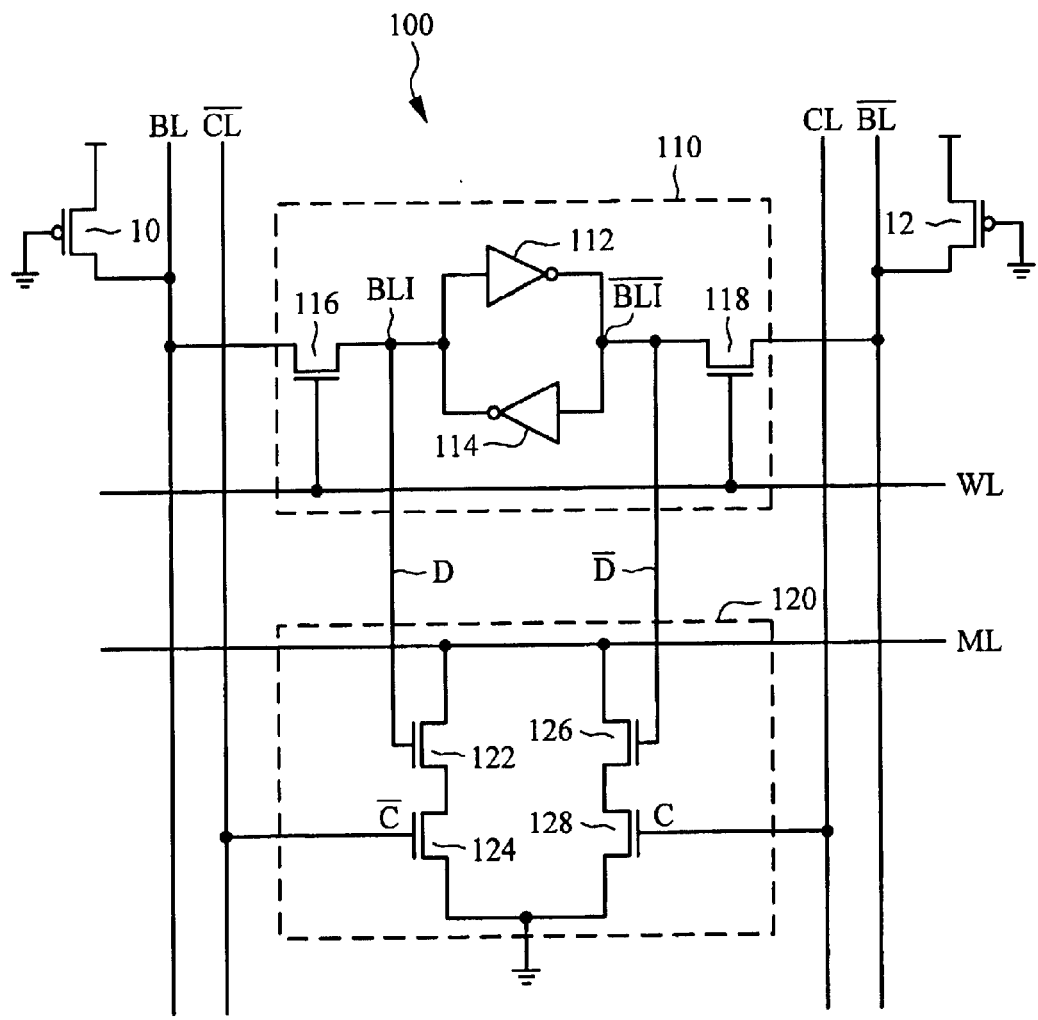
FIG. 1 is a circuit diagram of a conventional binary CAM cell having separate bit lines and comparand lines.
Figure 4A:
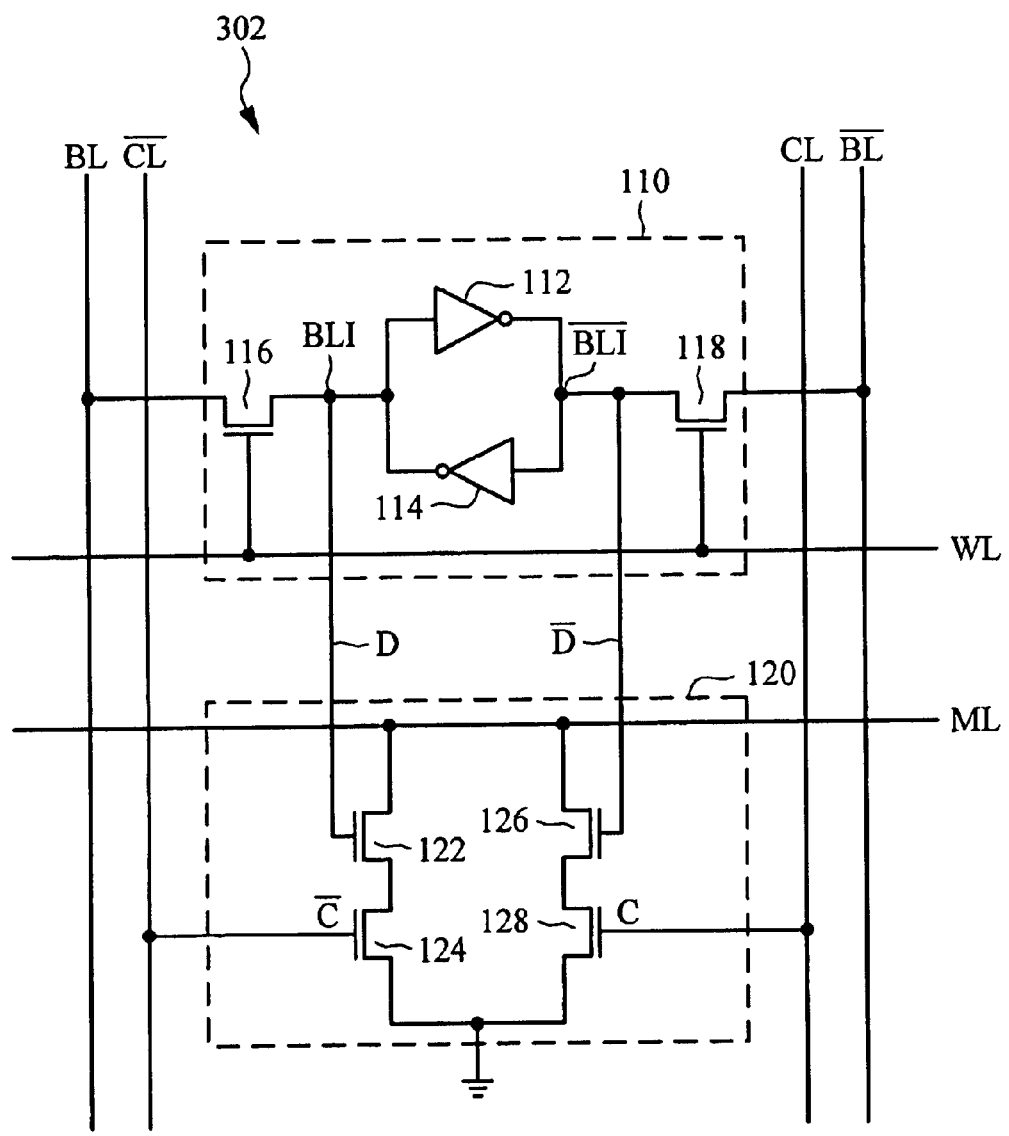
FIG. 4A is a circuit diagram of one embodiment of the CAM cells of FIG. 3.
Figure 5:
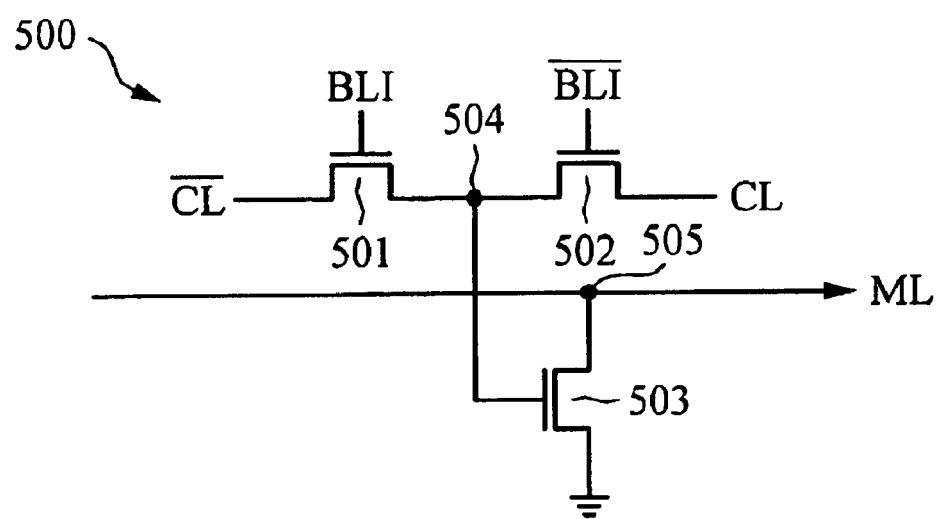
FIG. 5 is a circuit diagram of another embodiment of a compare circuit for the CAM cells of FIG. 3.

FIG. 4A shows one embodiment of CAM cell 302 that includes the memory cell 110 and compare circuit 120 of CAM cell 100 of FIG. 1, where inverters 112 and 114, may be any suitable inverters such as, for example, CMOS inverters. CAM cell 302 operates in a manner similar to that of CAM cell 100, as described above with respect to FIG. 1. For other embodiments, other suitable storage elements may be used for memory cell 110, and other suitable compare circuits may be used for compare circuit 120. For other embodiments, the well-known compare circuit 500 of FIG. 5 may be used for compare circuit 120.

Referring again to FIG. 3, each CAM cell 302 is coupled to the bit line pair BL and $\overline{BL}$, to the comparand line pair CL and $\overline{CL}$, and to corresponding word lines WL and match lines ML. The bit line pair BL and $\overline{BL}$ are coupled to read/write circuit 212 which, as mentioned earlier, includes well-known sense amplifiers (not shown for simplicity) to read data driven onto the bit line pair by a selected CAM cell 302. A sense-amp enable signal SAE selectively enables and disables the sense amplifiers within read/write circuit 212 for read operations.

For other embodiments, comparand line pair CL and $\overline{CL}$ may be eliminated, and bit line pair BL and $\overline{BL}$ may provide comparand data to CAM cells 302, as is commonly known in the art. For simplicity, various other well-known clock, enable, and control signals are not shown in FIG. 3.

Bit line control circuit 310a is coupled between bit line BL the supply voltage $V_{DD}$, and has an input to receive a bit line control signal BC. Similarly, bit line control circuit 310b is coupled between complementary bit line $\overline{BL}$ and $V_{DD}$, and has an input to receive BC. The bit line control signal BC may be generated by a clock circuit, by an instruction decoder, or by some other suitable means. As explained in detail below, bit line control circuits 310a and 310b adjust the charge currents for bit lines BL and $\overline{BL}$, respectively, in response to BC to minimize leakage currents in CAM cells 302 that could result in erroneous indications of the mismatch condition. For other embodiments, $\overline{BL}$ and bit line control circuit 310b may be eliminated. For some embodiments, signals BC and SAE may be complementary signals.

An exemplary operation of bit line control circuits 310a and 310b for concurrent read and compare operations for CAM device 200 is discussed below with respect to the qualitative timing diagram of FIG. 6. For this exemplary embodiment, the sensing phase of the read operation corresponds to the period between times t1 and t3, and the recovery phase of the read operation corresponds to the period beginning at time t3. For other embodiments, the sensing and recovery phases of the read operation may correspond to other time periods.

Prior to time t1, the bit lines BL and $\overline{BL}$ are charged to logic high by bit line control circuits 310a and 310b. The bit line control signal BC is initially de-asserted (e.g., to logic low), which causes bit line control circuits 310a and 310b to provide relatively small charge currents to BL and $\overline{BL}$, respectively.

At time t1, concurrent read and compare operations are commenced. Referring also to FIGS. 2–4, one of word lines WL is asserted to logic high (e.g., to $V_{DD}$) to select a corresponding row of CAM cells 302 for the read operation. SAE is asserted (e.g., to logic high) to enable sense amplifiers within read/write circuit 212 to sense data driven onto bit line pair BL and $\overline{BL}$. Also, the match lines ML are pre-charged to logic high (e.g., to $V_{DD}$) in a well-known manner, and the comparand bit C and its complement $\overline{C}$ are provided to CAM cells 302 via CL and $\overline{CL}$, respectively.

Figure 6:
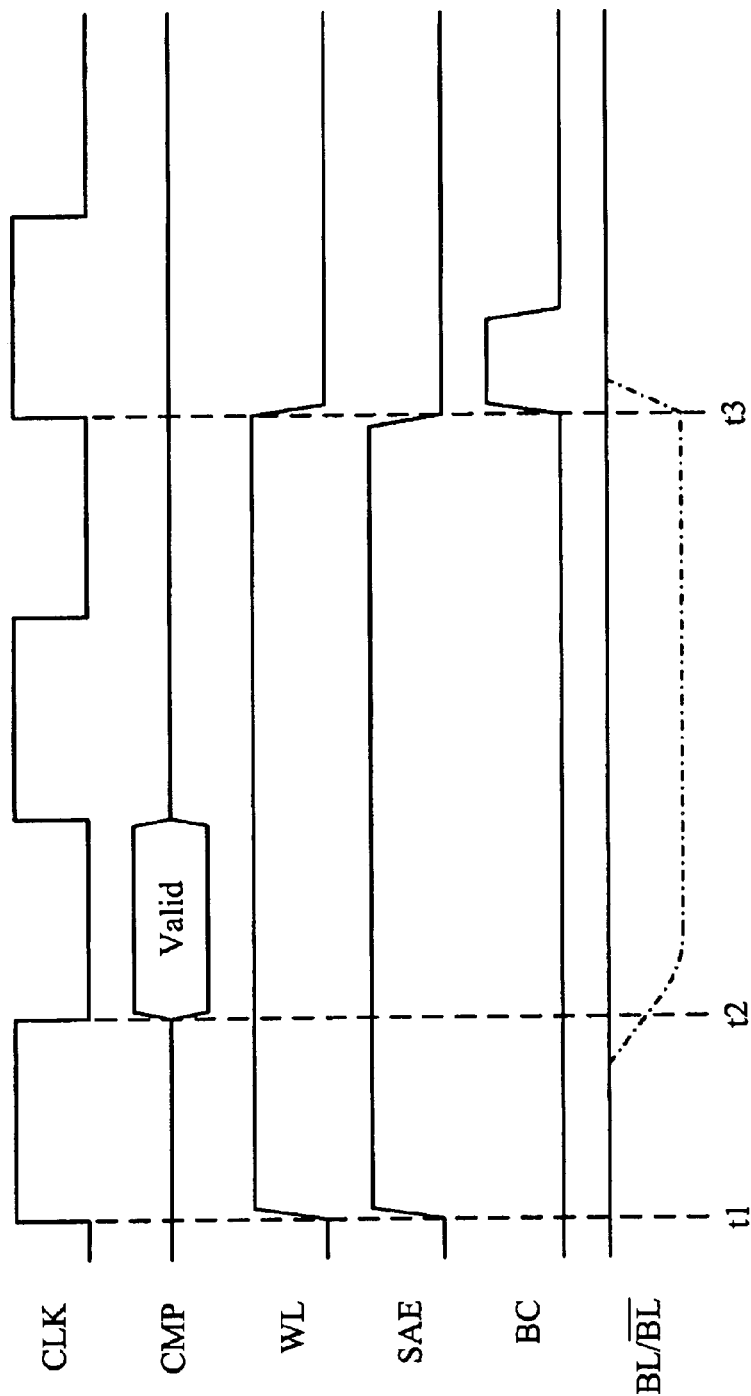
FIG. 6 is a qualitative timing diagram illustrating the operation of one embodiment of the bit line control circuit of FIG. 3.

By time t2, CAM cells 302 become responsive to bit comparisons between the comparand bit and data stored in CAM cells 302, as indicated by the valid CMP waveform, and thereafter generate match results on match lines ML (ML not shown in FIG. 6 for simplicity). Also by time t2, the CAM cells 302 in the row selected for reading begin driving corresponding bit line pairs BL and $\overline{BL}$ to complementary logic states according to the data bit stored therein (only one CAM cell 302 per row is shown in FIG. 3). Thus, for example, if a selected CAM cell 302 stores a logic zero data bit (D=0, $\overline{D}$=1), then the CAM cell 302 drives BL towards ground potential and drives $\overline{BL}$ towards $V_{DD}$. Conversely, if the selected CAM cell 302 stores a logic one data bit (D=1, $\overline{D}$=0), then the CAM cell 302 drives BL towards $V_{DD}$ and drives $\overline{BL}$ towards ground potential.

By time t3, data driven onto BL and $\overline{BL}$ by the selected CAM cell 302 is sensed by read/write circuit 212, which in turn may output the data onto DBUS. The selected word line WL is de-asserted (e.g., to logic low) to turn off pass transistors 116 and 118, which in turn isolate the CAM cell 302 from BL and $\overline{BL}$.

Also, SAE is de-asserted to logic low to disable the sense amplifiers within read/write circuit 212. Then, the bit line control signal BC is asserted (i.e., to logic high) for a predetermined time, which causes bit line control circuits 310a and 310b to provide relatively large bit line charge currents for BL and $\overline{BL}$, respectively, thereby quickly resetting BL and $\overline{BL}$ to the logic high state for subsequent operations.

Accordingly, during concurrent read and compare operations, bit line control circuits 310a and 310b provide relatively small bit line charge currents for BL and $\overline{BL}$ during the sensing phase of the read operation in order to minimize inadvertent voltage swings at data nodes BLI and $\overline{BLI}$ within CAM cells 302 that could result in erroneous indications of the mismatch condition. For example, referring to FIG. 4A, CAM cell 302 is selected for reading during a compare operation by asserting WL to turn on pass transistors 116 and 118. If the CAM cell 302 stores a logic zero data bit (e.g., D=0, $\overline{D}$=1), the relatively small bit line charge current provided by bit line control circuit 310a reduces the undesirable charging of node BLI towards $V_{DD}$ through pass transistor 116, thereby also reducing the gate voltage of compare transistor 122 to minimize undesirable leakage currents therein. Similarly, if the CAM cell 302 stores a logic one data bit (e.g., D=1, $\overline{D}$=0), the relatively small bit line charge current provided by bit line control circuit 310b reduces the undesirable charging of node $\overline{BLI}$ towards $V_{DD}$ through pass transistor 118, thereby also reducing the gate voltage of compare transistor 126 to minimize undesirable leakage currents therein. Thus, by minimizing undesirable leakage currents within compare transistors 122 and 126, bit line control circuits 310a and 310b improve the reliability of match results for CAM device 200.

Then, during the recovery phase of the read operation, bit line control circuits 310a and 310b provide relatively large bit line charge currents to quickly reset BL and $\overline{BL}$ to their logic high states, thereby minimizing latency between read operations. Because WL is de-asserted to turn off pass transistors 116 and 118 during the recovery phase of the read operation, the relatively large charge currents on BL and $\overline{BL}$ do not affect CAM node BLI and $\overline{BLI}$.

In addition to improving the reliability of match results during concurrent read and compare operations, bit line control circuits 310a and 310b may also reduce power dissipation associated with charging bit lines BL and $\overline{BL}$. For example, by providing relatively small bit line charge currents while pass transistors 116 and 118 are conductive, power dissipation resulting from current paths from $V_{DD}$ to ground potential via pass transistors 116 and 118 and pull-down transistors (not shown for simplicity) within CAM inverters 112 and 114 is minimized. Then, when pass transistors 116 and 118 are not conductive, relatively large bit line charge currents may be provided to quickly reset BL and $\overline{BL}$ to their logic high states.

Accordingly, BC may be asserted in response to the de-assertion of SAE, the de-assertion of the selected word line WL, or some other signal which indicates a transition from the sensing phase of the read operation to the recovery phase of the read operation. For some embodiments, BC may be de-asserted slightly before or after the de-assertion of WL and/or SAE. For other embodiments, BC may be de-asserted if there is a compare operation and asserted if there is not a compare operation, irrespective of whether there is a concurrent read operation.

Figure 4B:
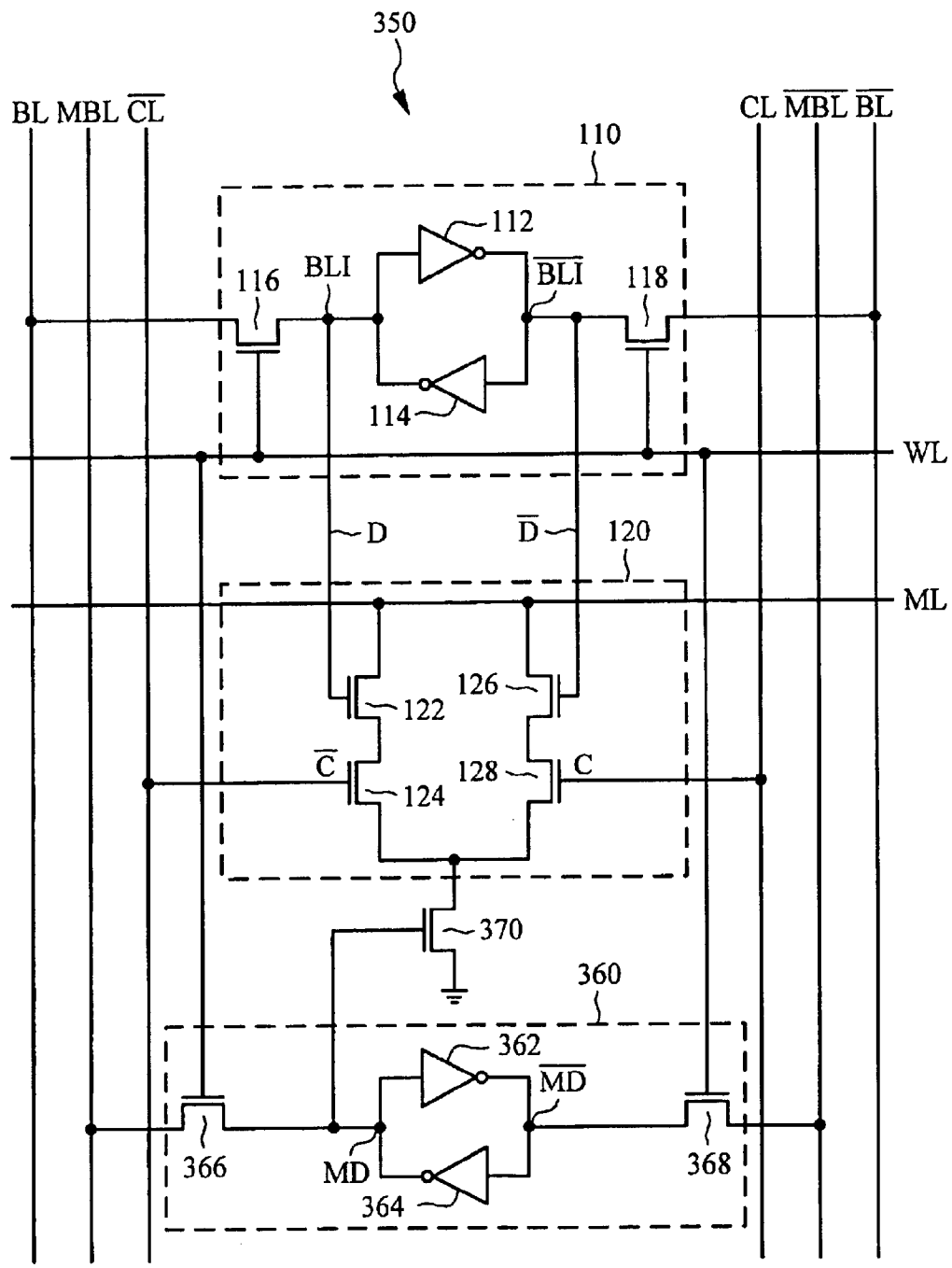
FIG. 4B is a circuit diagram of another embodiment of the CAM cells of FIG. .3.

As mentioned above, for other embodiments, CAM cell 302 may be a ternary CAM cell. For example, FIG. 4B shows a well-known ternary CAM cell 350 that is another embodiment of CAM cell 302. Ternary CAM (TCAM) cell 350 includes the memory cell 110 and compare circuit 120, and also includes a mask memory cell 360 and a mask circuit 370. Mask memory cell 360 includes a latch formed by cross-coupled inverters 362 and 364 that stores a mask data bit at node MD and its complement at node $\overline{\text{MD}}$. Pass transistor 366 is coupled between node MD and a mask bit line BL, and has a gate coupled to word line WL_out. Pass transistor 368 is coupled between node $\overline{\text{MD}}$ and a complementary mask bit line $\overline{\text{MBL}}$, and has a gate coupled to word line WL_out. Mask circuit 370 is an NMOS transistor connected between compare circuit 120 and ground potential and having a gate to receive the mask bit from node MD. For embodiments of FIG. 4B, additional bit line control circuits 310 may be coupled to MBL and $\overline{\text{MBL}}$ to minimize charge currents thereon during the sensing phase of read operations and to maximize charge currents thereon during the recovery phase of read operations.

Figure 4C:
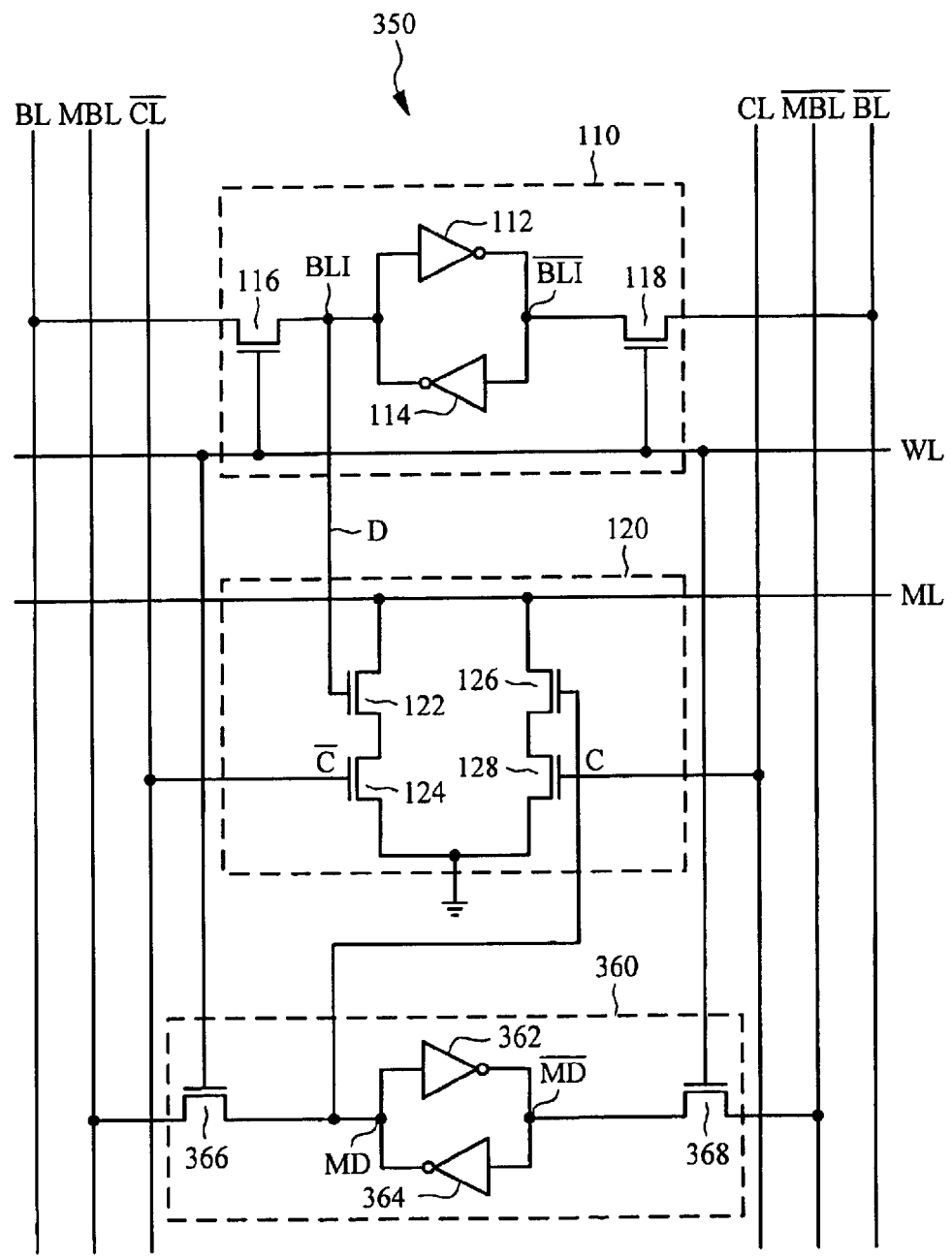
FIG. 4C is a circuit diagram of another embodiment of the CAM cells of FIG. 3.

For another embodiment of CAM cell 302, the CAM cell may be configured as a quaternary CAM cell. One embodiment of a quaternary CAM cell is shown in FIG. 4C as CAM cell 380. In contrast to CAM cell 350 of FIG. 4B, MD is coupled to the gate of transistor 126 instead of $\overline{\text{BLI}}$, and transistor 370 is removed. CAM cell 380 is referred to as a quaternary CAM cell because it can store effectively four states of information: (i) a logic 0 when BLI and MD are logic 0 and logic 1, respectively, (ii) a logic 1 when BLI and MD are logic 1 and logic 0, respectively, (iii) a don't care state (i.e., always match) when BLI and MD are both logic 0, and (iv) and an always mismatch state when BLI and MD are both logic 1.

The bit line control signal EC may be generated by any well-known pulse circuit, one-shot circuit, or self-timed circuit. For one embodiment, BC is asserted for approximately 1 nanosecond. For another embodiment, BC is maintained in the asserted state until the next concurrent read and compare operation.

Figure 7:
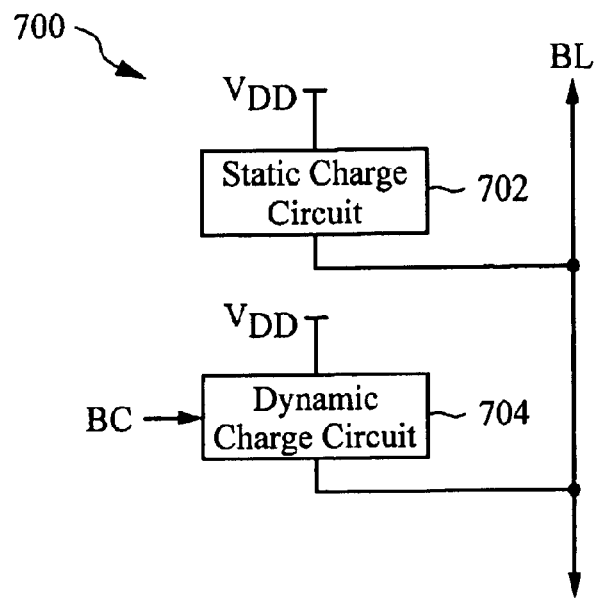
FIG. 7 is a block diagram of one embodiment of the bit line control circuit of FIG. 3.

FIG. 7 shows a bit line control circuit 700 that is one embodiment of bit line control circuits 310a and 310b of FIG. 3. Bit line control circuit 700 includes a static charge circuit 702 and a dynamic charge circuit 704. Static charge circuit 702 is coupled between $V_{DD}$ and bit line BL, and is maintained in a conductive state to continuously charge bit line BL towards $V_{DD}$. Because static charge circuit 702 is maintained in a conductive state, static charge circuit 702 may be referred to as a Direct Current (DC) charge circuit. Dynamic charge circuit 704 is coupled between bit line BL and $V_{DD}$, and includes an input to receive BC. Dynamic charge circuit 704 selectively charges bit line BL towards $V_{DD}$ in response to BC. Because dynamic charge circuit 704 selectively charges bit line BL, dynamic charge 704 may be referred to as an Alternating Current (AC) charge circuit.

For example, during the sensing phase of the read operation, the de-asserted state of BC disables dynamic charge circuit 704 from charging bit line BL, and static charge circuit 702 provides the relatively small bit line charge current described above. Then, during the recovery phase of the read operation, the asserted pulse for BC enables dynamic charge circuit 704, which in turn supplements the relatively small bit line charge current provided by static charge circuit 702 to more quickly charge bit line BL.

For some embodiments, dynamic charge circuit 704 has a much larger current-carrying capacity than does static charge circuit 702. In this manner, selectively enabling dynamic charge circuit 704 during the recovery phase of the read operation significantly boosts the bit line charge current, thereby minimizing latency between read operations. Further, because dynamic charge circuit 704 does not charge bit line BL during the sensing phase of the read operation, power dissipation resulting from bit line charging is minimized.

In addition, by sourcing more of the bit line charge current through dynamic charge circuit 704, present embodiments allow the size and current-carrying capacity of static charge circuit 702 to be minimized. Minimizing the current-carrying capacity of static charge circuit 702 minimizes current flow from $V_{DD}$ to ground potential during the sensing phase of the read operation, thereby advantageously reducing power consumption and minimizing erroneous match results.

The ratio of current-carrying capacities of static charge circuit 702 and dynamic charge circuit 704 may be adjusted depending upon desired operating characteristics, as well as upon the size, type, and specific configuration of the CAM cells 302 and their associated array architecture. The ratio should be sufficient to provide relatively quick charging of bit lines for read recovery while minimizing leakage currents in CAM cells selected for reading during compare operations. Thus, it is to be understood that the waveforms illustrated for bit lines BL and $\overline{\text{BL}}$ in FIG. 6 are exemplary; for some embodiments, the charge rate (e.g., slope) for the bit lines resulting from static charge circuit 702 and/or dynamic charge circuit 704 may be greater than shown in FIG. 6, while for other embodiments the charge rate for the bit lines resulting from static charge circuit 702 and/or dynamic charge circuit 704 may be less than shown in FIG. 6. Similarly, the discharge rate for the bit lines may be greater or less than illustrated in FIG. 6.

For some embodiments, static charge circuit 702 may be eliminated, in which case bit line control circuit 700 provides a relatively large bit line charge current when BC is asserted and provides no bit line charge current when BC is not asserted.

Figure 8:
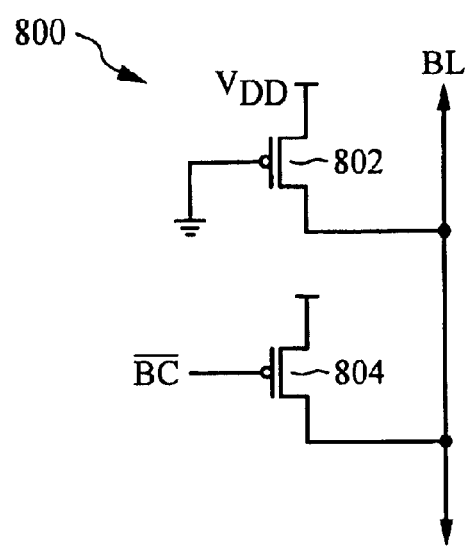
FIG. 8 is a circuit diagram of one embodiment of the bit line control circuit of FIG. 7.

FIG. 8 shows a bit line control circuit 800 that is one embodiment of bit line control circuit 700 of FIG. 7. Bit line control circuit 800 includes a relatively weak PMOS pull-up transistor 802 that is one embodiment of static charge circuit 702, and a relatively strong PMOS pull-up transistor 804 that is one embodiment of dynamic charge circuit 704. Weak pull-up transistor 802 is coupled between $V_{DD}$ and bit line BL, and has a gate tied to ground potential to maintain transistor 802 in a conductive state. Strong pull-up transistor 804 is coupled in parallel with static pull-up transistor 802 to provide an additional charge path between $V_{DD}$ and bit line BL. The gate of strong pull-up transistor 804 is responsive to $\overline{\text{BC}}$.

Thus, if $\overline{\text{BC}}$ is de-asserted (e.g., to logic high), strong pull-up transistor 804 is turned off, and weak pull-up transistor 802 provides a relatively small charge current for bit line BL. Conversely, if $\overline{\text{BC}}$ is asserted (e.g., to logic low), strong pull-up transistor 804 turns on and supplements the charge current provided by weak pull-up transistor 802 to more quickly charge bit line BL towards $V_{DD}$.

Strong pull-up transistor 804 has a much larger current-carrying capacity than does relatively weak pull-up transistor 802. For one embodiment, strong pull-up transistor 804 has a drive strength approximately 50% greater than that of weak pull-up transistor 802.

For some embodiments, the polarity of pull-up transistors 802 and/or 804 may be suitably reversed in a well-known manner as may be required by specific applications. For instance, in one embodiment, strong pull-up transistor 804 may be an NMOS transistor having a gate coupled to receive BC, and weak pull-up transistor 802 may be an NMOS transistor having a gate tied to $V_{DD}$. For another embodiment, weak pull-up transistor 802 may be eliminated.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A content addressable memory (CAM) array having any number of columns, each of the columns comprising:
   a plurality of CAM cells coupled to a bit line; and
   a bit line control circuit coupled to the bit line and having an input to receive a control signal, wherein the bit line control circuit minimizes a bit line charge current during a sensing phase of a read operation.

2. The CAM array of claim 1, wherein the bit line control circuit adjusts the charge current for the bit line in response to the control signal.

3. The CAM array of claim 1, wherein the bit line control circuit maximizes the bit line charge current during a recovery phase of the read operation.

4. A content addressable memory (CAM) array having any number of columns, each of the columns comprising:
   a plurality of CAM cells coupled to a bit line; and
   a bit line control circuit coupled to the bit line and having an input to receive a control signal, wherein the bit line control circuit minimizes a bit line charge current when there is a compare operation and maximizes the bit line charge current when there is not a compare operation.

5. A content addressable memory (CAM) array having any number of columns, each of the columns comprising:
   a plurality of CAM cells coupled to a bit line; and
   a bit line control circuit coupled to the bit line and having an input to receive a control signal, wherein the bit line control circuit comprises a dynamic charge circuit coupled between the bit line and a supply voltage, the dynamic charge circuit having an input responsive to the control signal.

6. The CAM array of claim 5, wherein the bit line control circuit further comprises:
   a static charge circuit coupled between the bit line and the supply voltage.

7. The CAM array of claim 6, wherein:
   the static charge circuit provides a relatively small bit line charge current; and
   the dynamic charge circuit selectively provides a relatively large bit line charge current in response to the control signal.

8. The CAM array of claim 6, wherein:
   the static charge circuit comprises a first transistor coupled between the bit line and the supply voltage and having a gate coupled to a predetermined voltage; and
   the dynamic charge circuit comprises a second transistor coupled between the bit line and the supply voltage and having a gate to receive the control signal.

9. The CAM array of claim 8, wherein the first and second transistors comprise PMOS transistors.

10. The CAM array of claim 8, wherein the second transistor is 50% stronger than the first transistor.

11. The CAM array of claim 5, wherein the dynamic charge circuit is enabled if there is not a compare operation.

12. The CAM array of claim 5, wherein the dynamic charge circuit is disabled during a compare operation.

13. The CAM array of claim 5, wherein the dynamic charge circuit is disabled during a sensing phase of a read operation.

14. The CAM array of claim 5, wherein the dynamic charge circuit is enabled during a recovery phase of a read operation.

15. A content addressable memory (CAM) array having any number of columns, each of the columns comprising:
   a plurality of CAM cells coupled to a bit line; and
   means for adjusting a charge current for the bit line in response to a control signal, wherein the means for adjusting comprises:
   means for providing a relatively small bit line charge current during a sensing phase of a read operation; and
   means for providing a relatively large bit line charge current during a recovery phase of the read operation.

16. The CAM array of claim 15, wherein the means for providing a relatively large bit line charge current is disabled during the sensing phase of the read operation.

17. A content addressable memory (CAM) array having any number of columns, each of the columns comprising:
   a plurality of CAM cells coupled to a bit line; and
   means for adjusting a charge current for the bit line in response to a control signal, wherein the means for adjusting comprises:
   means for providing a relatively small bit line charge current when there is a compare operation; and
   means for providing a relatively large bit line charge current when there is not a compare operation.

18. The CAM array of claim 17, wherein the means for providing a relatively large bit line charge current is disabled during the compare operation.

19. A content addressable memory (CAM) array having any number of columns, each of the columns comprising:
   a plurality of CAM cells coupled to a bit line; and
   means for adjusting a charge current for the bit line in response to a control signal, wherein the means for adjusting comprises:
   a first transistor coupled between the bit line and a supply voltage, and having a gate coupled to a predetermined voltage; and
   a second transistor coupled between the bit line and the supply voltage, and having a gate responsive to the control signal.

20. The CAM array of claim 19, wherein the first and second transistors comprise PMOS transistors.

21. A content addressable memory (CAM) array having any number of columns, each of the columns comprising:
   a plurality of CAM cells coupled to a bit line; and
   means for adjusting a charge current for the bit line in response to a control signal, wherein the means for adjusting comprises:
   a static charge circuit coupled between the bit line and a supply voltage terminal; and
   a dynamic charge circuit coupled between the bit line and the supply voltage terminal, and responsive to the control signal.

22. The CAM array of claim 21, wherein the dynamic charge circuit has a drive strength 50% stronger than the static charge circuit.

* * * * *